United States Patent
Böhme et al.

[19]

[11] Patent Number: 5,930,697
[45] Date of Patent: Jul. 27, 1999

[54] HETERODYNE RECEIVER WITH SYNCHRONOUS DEMODULATION FOR RECEIVING TIME SIGNALS

[75] Inventors: Rolf Böhme, Bad Friedrichshall; Matthias Eichin, Heilbronn, both of Germany

[73] Assignee: Temic Telefunken microelectronic GmbH, Heilbronn, Germany

[21] Appl. No.: 08/662,446

[22] Filed: Jun. 10, 1996

[30] Foreign Application Priority Data

Jun. 16, 1995 [DE] Germany .......................... 195 21 908

[51] Int. Cl.⁶ .......................................... H04M 5/46
[52] U.S. Cl. .......................... 455/315; 455/313; 455/323; 455/260; 375/294; 375/376
[58] Field of Search .................... 455/313, 323, 455/325, 326, 333, 334, 189.1, 190.1, 207–209, 260, 264, 20–22, 255, 256, 315, 316; 331/2; 375/215, 293, 294, 327, 373, 375, 376

[56] References Cited

U.S. PATENT DOCUMENTS

| | | | |
|---|---|---|---|
| 4,768,178 | 8/1988 | Conklin et al. | 368/47 |
| 4,823,328 | 4/1989 | Conklin et al. | 368/47 |
| 4,905,307 | 2/1990 | Frank | 445/209 |
| 5,075,639 | 12/1991 | Taya | 331/2 |
| 5,283,532 | 2/1994 | Burkhart et al. | 455/260 |
| 5,329,250 | 7/1994 | Imaizumi et al. | 331/2 |
| 5,542,114 | 7/1996 | Kojima et al. | 455/196.1 |
| 5,572,264 | 11/1996 | Mizukami et al. | 455/245.2 |
| 5,600,680 | 2/1997 | Mishima et al. | 375/327 |
| 5,654,674 | 8/1997 | Matsuno | 331/1 R |
| 5,697,089 | 12/1997 | Lundqvist et al. | 455/315 |

FOREIGN PATENT DOCUMENTS

| | | | |
|---|---|---|---|
| 3309352 | 10/1984 | Germany | H04J 1/04 |
| 3335024 | 4/1985 | Germany | H03L 7/06 |
| 4125995 | 12/1992 | Germany | H04B 1/30 |
| 4302301 | 8/1994 | Germany | H04B 1/26 |
| 5129843 | 9/1993 | Japan | H04N 5/44 |
| 2258776 | 2/1993 | United Kingdom | H04B 1/26 |

*Primary Examiner*—Tommy P. Chin
*Assistant Examiner*—Vu Le
*Attorney, Agent, or Firm*—Venable; George H. Spencer; Norman N. Kunitz

[57] ABSTRACT

A heterodyne receiver operating on the principle of synchronous modulation for time-signal reception where a first mixer is driven by the first phase-locking loop which is fed from a reference frequency source and a switchable precharging value. By means of switched frequency dividers and the precharging values, internationally different clock frequencies (JP: 40 kHz; USA/GB: 60 kHz; EU/D: 77.5 kHz) can be processed and converted to the intermediate frequencies. These are then synchronously demodulated by means of a second mixer which receives its signal from the second phase-locking loop that is driven through the intermediate frequency signal via the phase comparator, and also through the control signal of the phase-locking loop, so that only residual error adjustment need be performed.

16 Claims, 2 Drawing Sheets

HETERODYNE RECEIVER WITH SYNCHRONOUS DEMODULATION FOR RECEIVING TIME SIGNALS

BACKGROUND OF THE INVENTION

The invention relates to a heterodyne receiver with synchronous demodulation for receiving the radio signals from a time-signal transmitter, comprising an input circuit, a first mixer, driven by a first phase-locking loop that is controlled by a reference source, a bandpass filter and a second mixer for the direct mixing synchronous demodulator with output circuit connected behind in series, where the bandpass filter supplies an intermediate frequency to the second mixer.

A heterodyne receiver operating on the principle of synchronous demodulation is described in the publication DE 41 25 995 A1. In this receiver, a controlled oscillator arrangement is presynchronized in a presynchronization phase to a desired oscillator frequency through a first control loop with the help of a reference frequency source, generally the oscillator of an autonomous quartz clock with a frequency of 32768 Hz. This is followed by switching over to a second control loop and synchronizing to the received useful signal. In a synchronous demodulation, the frequency selection is performed by means of low-pass filters connected behind in series instead of a (quartz) bandpass filter. In accordance with DE 41 25 995 A1, the input signal is first converted to an intermediate frequency in order to avoid undesired interference of the antenna signal by the oscillator signal.

In order to bring the reception frequency of the receiver as accurately as possible to the desired value with the help of the reference frequency in the presynchronization phase, elaborate frequency dividers are necessary. Expense and space requirement in an integrated circuit and also the current requirement have a negative effect. This disadvantage is even greater if the receiver is to be designed for several reception frequencies because the expense of the control increases further. Owing to the relatively broad tolerances in the manufacture of integrated circuits, a wide interception range is necessary for presynchronization. On the other hand, owing to the signal-to-noise ratio, a much smaller interception range is required for the useful signal. This has the disadvantage, however, that if the transmitter fails for a short period of time or if there is a malfunction, the synchronization is usually lost and the ready-to-receive state must be established again by renewing the presynchronization.

SUMMARY OF THE INVENTION

The object of the invention is to provide a heterodyne receiver with synchronous demodulation that requires no presynchronization, that is again immediately ready to operate after malfunctions or transmitter failures, and that allows changing over between different transmitter frequencies with little extra effort.

According to the invention there is a heterodyne receiver designed on the principle of synchronous demodulation for time-signal reception comprising an input stage, a first mixer driven by means of a first switched phase-locking loop that is controlled by a reference quartz source, a bandpass filter for the generated intermediate frequency, and a second mixer for the direct mixing synchronous demodulator with output circuit connected behind in series, where the frequency of the second mixer is generated by a second phaselocking loop and the control signal of the second phase-locking loop is formed with the help of the control signal of the first phase-locking loop.

A heterodyne receiver not requiring presynchronization is thereby provided which is characterized by being completely integratable and is able to receive several time-signal transmitters (multirange reception).

BRIEF DESCRIPTION OF THE DRAWINGS

The invention will now be described on the basis of embodiment examples together with FIGS. 1 and 2., wherein.

DESCRIPTION OF THE PREFERRED EMBODIMENTS

Figure 1:
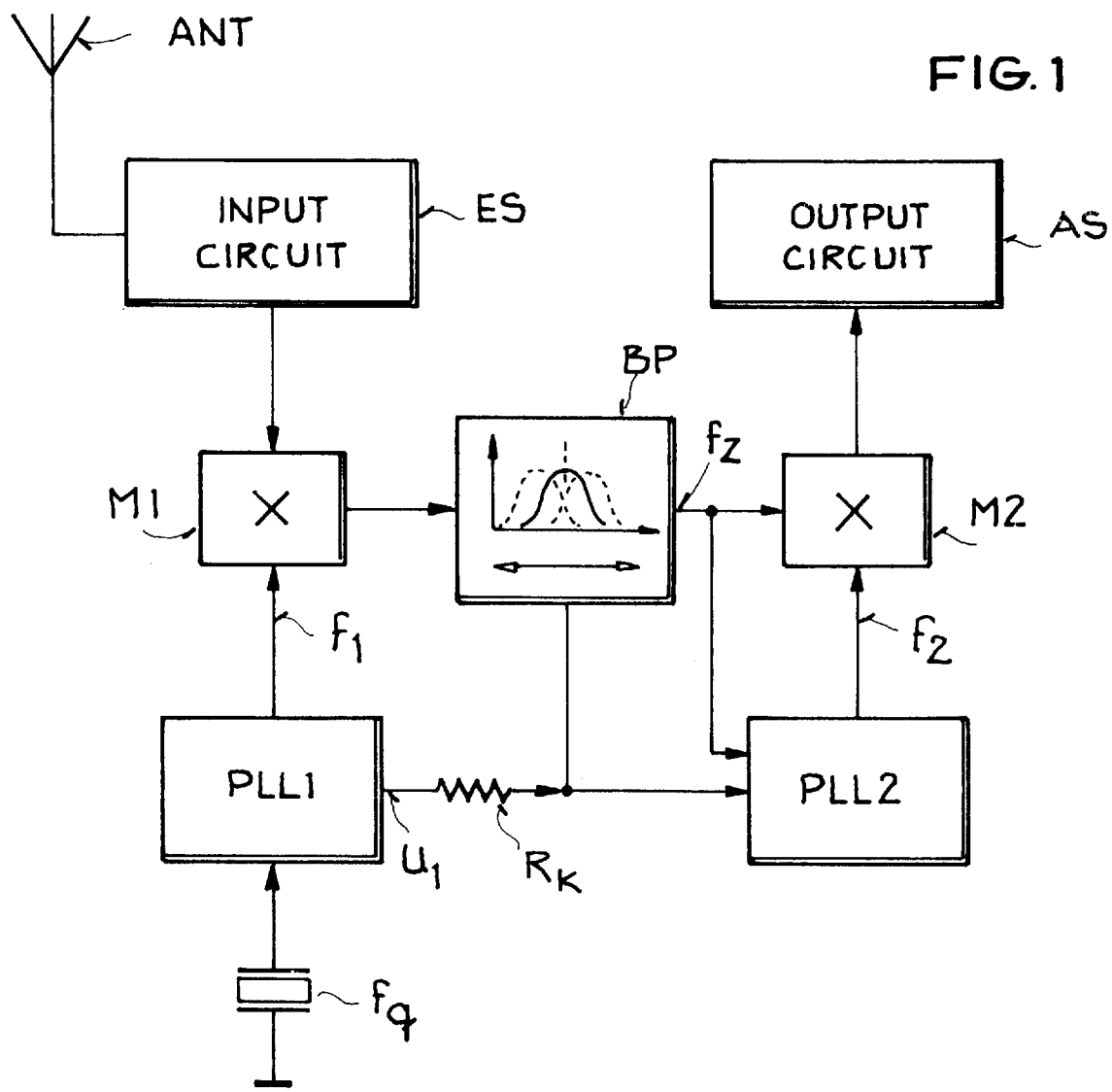
FIG. 1 is a block diagram of the receiver according to the invention.

FIG. 1 shows in block diagram form the principle of the circuit according to the invention. The time signal is received through an antenna and transferred to an input circuit ES. The signal passes from there to a first mixer M1 where it is converted by a frequency f1 generated by a first phase-locking loop PLL1; the phase-locking loop PLL1 itself is controlled by a reference source fq. An intermediate frequency signal fz is obtained by then filtering through a bandpass filter BP. This intermediate frequency signal is demodulated synchronously in a second mixer M2 and transferred to an output circuit AS. For the purpose of synchronous demodulation, a second phase-locking loop PLL2 generates an output frequency f2=fz that is fed to the second mixer M2 and is synchronized with the intermediate frequency fz. In order to facilitate synchronization and to maintain it under difficult reception conditions, a portion of the control signal u1 from the first phase-locking loop PLL1, weighted by the resistor Rk, is added to the control signal of the second phase-locking loop PLL2. (The weighting can be effected just as well by another method, e.g. by means of an area ratio.) It is also provided for a weighted portion of the control signal u1 to be supplied to the bandpass filter BP. This is advantageous in particular when the bandpass filter BP is designed with similar circuit elements as the controlled oscillator of the second phase-locking loop and can be controlled in the same way.

The circuit design of the block diagram will now be described with reference to FIG. 2:

The radio reception signal picked up by the antenna ANT is amplified in a controllable amplifier AMP with adjustable gain and fed to the first mixer M1 for converting to an intermediate frequency state. The heterodyne signal f1 required for this is generated in a first phase-locking loop PLL1. The phase-locking loop PLL1 comprises a controlled oscillator VC01 whose control signal u1 is taken from an adder A1 that receives a signal from a phase comparator PD through a loop filter LF1 and a second signal as precharging value v from a switching source SW1. The first input of the phase comparator PD is connected to the output of the controlled oscillator VC01 through a frequency divider DIV1 which can preferably be set to the divider factors 1 and 2. Similarly, in front of the second input of the phase comparator PD, a frequency divider DIV2 with the same characteristics is connected and is supplied from a reference source Q.

The first mixer M1 transfers the amplified input signal fe into an intermediate frequency signal fz that is filtered in a bandpass filter BP. The intermediate frequency signal fz is then synchronously demodulated (rectified) by mixing with an in-phase heterodyne signal f2 in a second mixer M2. A second phase locking loop PLL2 generates this heterodyne signal f2.

The second phase-locking loop PLL2 comprises a controlled oscillator VC02. The controlled oscillator VC02 has two outputs that supply two output signals f2, f2' displaced by 90°. This can also be accomplished by a frequency divider DIV3 connected behind in series. The control signal u2 of the oscillator VC02 is taken from an adder A2. The adder A2 receives a signal s2 from a phase comparator M3 through a loop filter LF2 and the weighted portion u1' of the control signal u1. The first input of the phase comparator M3 is connected to the second output of the controlled oscillator VC02. The second input of the phase comparator M3 is connected to the output of the bandpass filter BP.

Alternatively, the bandpass filter BP can be equipped with two outputs for two signals that are 90° out-of-phase with each other while the controlled oscillator VC02 has only one output.

The control signal u1' is formed from the control signal u1 of the first phase-locking loop PLL1 by being weighted by a resistor Rk or by another method. If voltages have been provided for the signal values, u1' can be formed from u1 through a switching voltage divider SW2. Depending on the intended reception frequencies, switching of the frequency dividers DIV1 and DIV2, the switching source SW1 and the switching voltage divider SW2 is coordinated together as will be explained in more detail further below.

The output signal f0 of the mixer M2 contains a steady component in accordance with the signal amplitude and from which undesired signal components are removed in the following low-pass filter LPF. In order to maintain the gain control in the event of non-latched operation if the mixer M2 does not output a steady component, a rectifier or absolute-value generator REC is added to the low-pass filter LPF. The time information, which consists of amplitude dips of various duration, is reshaped into bivalent data signals in a circuit ST with Schmitt trigger characteristics and decoded in a decoder DEC.

The control voltage g for setting the controlled amplifier AMP is produced in a conventional way in an auxiliary circuit AGC from the rectified signal u0 at the output of the rectifier REC.

Figure 2:
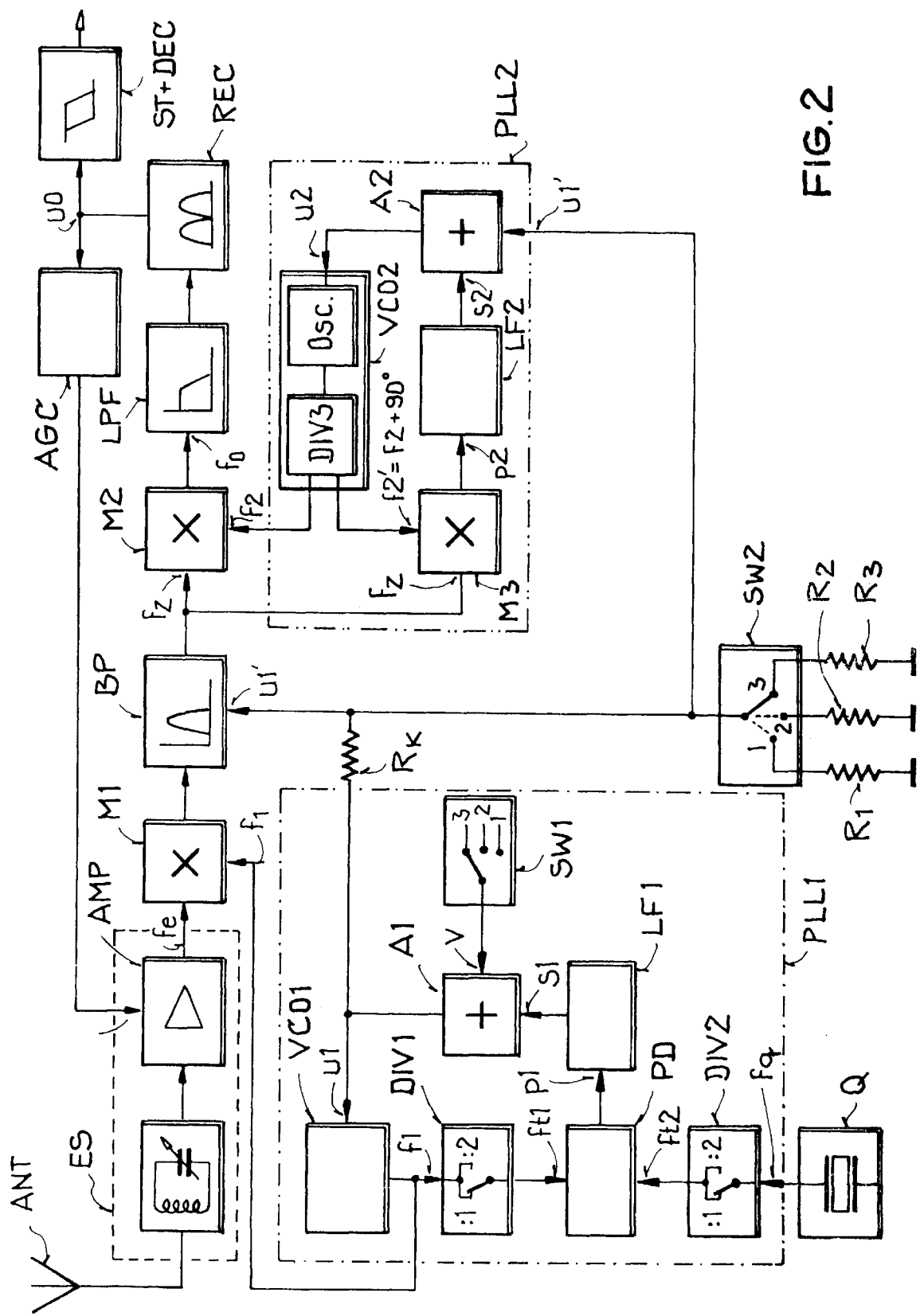
FIG. 2 is a circuit diagram of the embodiment example given in FIG. 1.

For the intended reception frequencies (40 kHz, 60 kHz and 77.5 kHz) in the embodiment example according to FIG. 2, three corresponding intermediate frequencies are generated. An intermediate frequency value of around 5 kHz is aimed for because this represents a good compromise between image frequency supression and selectivity of the bandpass filter BP. The dividers DIV1 and DIV2 as well as the switching source SW1 of the first phase-locking loop PLL1 are set according to the desired reception frequency. The frequency of the controlled oscillator VCO1 is not only determined by the reference frequency fq and the divider factors, however, but also by the precharging value v that is set by switch SW1 and which can cause latching to an odd-numbered harmonic. For example, it is intended for the first reception frequency of 77.5 kHz that the first divider DIV1 be set to the divider factor one, the second divider DIV2 to the divider factor two and that the precharging value v of the switching source SW1 set the controlled oscillator VCo1 approximately to the fifth harmonic of half the reference frequency fq/2. This setting thus causes the VCO1 to latch to a set frequency of 81.92 kHz.

For the second reception frequency of 60 kHz, at which the oscillator VCO1 latches to the fundamental wave, the first divider DIV1 is set to the divider factor of two and the second divider DIV2 is set to the divider value of one. Under these conditions, the controlled oscillator VCO1 settles at twice the reference frequency 2*fq=65.536 kHz by suitably selecting the precharging value v of the switched source SW1.

The third reception frequency of 40 kHz requires that the first divider DIV1 and the second divider DIV2 be set to the divider value one. By selecting a precharging value v of the switched source SW1 that sets the controlled oscillator VCO1 to the reference value fq itself, latching to the desired frequency of 32.768 kHz is achieved.

By setting the first oscillator VCO1 from the external reference frequency fq through the phase-locking loop, its frequency f1 is secured independently of the tolerances typical for integration. Deviations from the command value are possible only if the reference frequency deviates or if the phase-locking loop does not latch, which would signify a functional failure. Having been set precisely, the control signal u1 of the controlled oscillator VCO1 depends however on the tolerances of the IC elements. But since the tolerances of all similarly designed oscillators and filters are similar, the control signal u1 can be used as reference for setting other selective function units. Assuming a linear control function, which can be obtained relatively accurately in a transconductance control for instance, the function units linked to the control signal u1 can be set through dividers or amplifiers to fractions or multiples of the reference frequency f1. Deviations then occur only within the framework of the relative tolerances inside the integrated circuit, and these can be approximately two orders of magnitude smaller than the absolute tolerances. For the presetting of the controlled oscillator VC02, this means that it can be set relatively accurately to its desired frequency and that the second phase-locking loop PLL2 requires only a small interception range. In this way, the system is prevented from being able to latch onto a disturbance frequency that is situated in the vicinity of the reception frequency.

In the event of the control signals being provided in the form of voltages, FIG. 2 shows weighting by the switching voltage divider SW2. Depending on which reception frequency has been set, the resistors R1 to R3 are connected in series to resistor Rk and thus the control signal u1' is generated for controlling the mid-band frequency of the bandpass filter BP and for presetting the controlled oscillator VC02.

What is claimed is:

1. Heterodyne receiver operating on the principle of synchronous demodulation for time-signal reception, comprising: an input circuit (ES) for providing an input signal, a first mixer (M1) receiving the input signal at a first input, said first mixer being driven by a first phase-locking loop circuit (PLL1) having a controlled oscillator (VCO1) which supplies a first frequency signal (f1) to a further input of the first mixer, with the first phase-locking loop circuit (PLL1) being controlled by a reference frequency signal (fq) which is compared with the first frequency signal (f1) to generate a control signal (u1) for the controlled oscillator (VC01) of the first phase-locking loop circuit (PLL1), a bandpass filter (Bp) connected to the output of said first mixer, and a second mixer (M2) for the direct mixing synchronous demodulator (M2, PLL2), an output circuit (AS) connected behind and in series with said second mixer, where the bandpass filter (Bp) supplies an intermediate frequency signal(fz) to an input of the second mixer (M2), wherein a further frequency signal (f2) supplied to another input of the second mixer (M2) is generated by a second phase-locking loop circuit (PLL2), which is independent of said first phase-locking loop circuit (PLL1), and the control signal for a controlled oscillator (VC02) of the second phase-locking loop circuit (PLL2) is formed from the intermediate frequency signal (fz) and the control signal (u1) for the controlled oscillator of the first phase-locking loop circuit (PLL1) circuit.

2. Heterodyne receiver operating on the principle of synchronous demodulation for time-signal reception, comprising an input circuit (ES) for providing an input signal, a first mixer (M1) receiving the input signal, said first mixer being driven by a first phase-locking loop circuit (PLL1) that is controlled by a reference source (fq), a bandpass filter (Bp) connected to the output of said first mixer, and a second mixer (M2) for the direct mixing synchronous demodulator (M2, PLL2), an output circuit (AS) connected behind and in series with said second mixer, with the bandpass filter (Bp) supplying an intermediate frequency signal (fz) to an input of the second mixer (M2), wherein a further frequency (f2) supplied to another input of the second mixer (M2) is generated by a second phase-locking loop circuit (PLL2), which is independent of said first phase-locking loop circuit, and the control signal for a controlled oscillator (VC02) of the second phase-locking loop circuit (PLL2) is formed from the intermediate frequency signal (fz) and a control signal (u1) for a controlled oscillator (VC01) of the first phase-locking loop circuit (PLL1) circuit; and, wherein in the first phase-locking loop circuit (PLL1), the control signal (u1) is formed from a precharging value (v) and the output signal (p1) of a phase comparator (PD).

3. Heterodyne receiver in accordance with claim 2, wherein the precharging value (v) is switched over or controlled depending on the reception frequency.

4. Heterodyne receiver in accordance with claim 3, wherein the controlled oscillator (VC02) of the second phase-locking loop circuit (PLL2) has two outputs that supply two output signals (f2, f2') 90° out of phase with each other.

5. Heterodyne receiver in accordance with claim 4, wherein the controlled oscillator (VC02) of the second phase-locking loop circuit (PLL2) is made up of a primary oscillator (OSZ) and a frequency divider (DIV3) connected behind and in series with the primary oscillator, and wherein the frequency divider (DIV3) has two outputs that supply two output signals (f2, f2') 90° out of phase with each other.

6. Heterodyne receiver in accordance with claim 5, wherein the controlled oscillator (VC02) of the second phase-locking loop circuit (PLL2) is connected to the second mixer (M2) and the second output (f2') of the controlled oscillator (VC02) of the second phase-locking loop circuit (PLL2) is connected to a phase comparator (M3) of the second phase-locking loop circuit (PLL2).

7. Heterodyne receiver in accordance with claim 6, wherein the control signal for the controlled oscillator of the second phase-locking loop circuit (PLL2) is a weighted control signal (u1') formed from the control signal (u1) of the controlled oscillator of the first phase-locking loop circuit (PLL1) by division or amplification and/or switching over.

8. Heterodyne receiver in accordance with claim 6, wherein a summing circuit (A2) is provided, the first input of which receives the output signal (p2, s2) of the phase detector (M3) of the second phase-locking loop circuit (PLL2), the second input of which receives the weighted control signal (u1') of the first phase-locking loop circuit (PLL1), and the output (u2) of which is connected to the control input of the controlled oscillator (VC02) of the second phase-locking loop circuit (PLL2).

9. Heterodyne receiver in accordance with claim 8, wherein the mid-band frequency of the bandpass filter (BP) can be controlled electronically.

10. Heterodyne receiver in accordance with claim 9, wherein the mid-band frequency of the bandpass filter (BP) is controlled by the weighted control signal (u1') of the first phase-locking loop circuit (PLL1).

11. Heterodyne receiver in accordance with claim 10, wherein the output (f1) of the controlled oscillator (VCC1) of the first phase-locking loop circuit (PLL1) is connected to the input of a first divider (DIV1) of the first phase-locking loop circuit (PLL1), which first divider can be switched to divider factors 1 and 2 and whose output (ft1) is connected to the first input of the phase comparator (PD) of the first phase-locking loop circuit (PLL1).

12. Heterodyne receiver in accordance with claim 11, wherein the output (fq) of the reference frequency (q) of the first phase-locking loop circuit (PLL1) is connected to the input of a second divider (DIV2) of the first phase-locking loop circuit (PLL1), which second divider can be switched to divider factors 1 and 2 and whose output (ft2) is connected to the second input of the phase comparator (PD) of the first phase-locking loop circuit (PLL1).

13. Heterodyne receiver in accordance with claim 12, wherein the output signal (f1) of the first phase-locking loop circuit (PLL1) has the value 81.92 kHz for a reception frequency (fe) of 77.5 kHz, the first divider (DIV1) is set to divider factor 1 and the second divider (DIV2) to the divider factor 2.

14. Heterodyne receiver in accordance with claim 12, wherein the heterodyne signal (f1) of the first phase-locking loop circuit (PLL1) has the value 65.536 kHz for a reception frequency (fe) of 60 kHz, the first divider (DIV1) is set to divider factor 2 and the second divider (DIV2) to the divider factor 1.

15. Heterodyne receiver in accordance with claim 12, wherein the heterodyne signal (f1) of the first phase-locking loop circuit (PLL1) has the value 32.768 kHz for a reception frequency (fe) of 40 kHz, the first divider (DIV1) is set to divider factor 1 and the second divider (DIV2) to the divider factor 1.

16. A heterodyne receiver operating on the principle of synchronous demodulation for time-signal reception, comprising: an input circuit (ES) for providing an input signal, a first mixer (M1) receiving the input signal at a first input; a first phase-locking loop circuit (PLL1) having a first controlled oscillator; a reference source connected to a second input of the first phase-locking loop circuit to provide a constant frequency reference signal (fq) to the first phase-locking loop circuit for control thereof; a bandpass filter (Bp) connected to the output of said first mixer and providing an intermediate frequency (fz) signal at its output; a second mixer (M2) for the direct mixing synchronous demodulation, with said second mixer having an output connected to an output circuit (AS), and a first input connected to the output of said bandpass filter (Bp) to supply the intermediate frequency signal (fz) to the second mixer (M2); a second phase-locking loop circuit (PLL2), which is independent of said first phase-locking loop circuit, having its output connected to a second input of the second mixer and having a second controlled oscillator for supplying a further frequency signal (f2) to the second mixer; and a circuit connecting the output of said bandpass filter and the first phase-locking loop circuit to said second phase-locking loop circuit and forming a control signal for the controlled oscillator of the second phase-locking loop circuit (PLL2) from the intermediate frequency signal (fz) and a control signal (u1) for a controlled oscillator of the first phase-locking loop circuit (PLL1) circuit.

\* \* \* \* \*